United States Patent [19]

Varker et al.

[11] Patent Number: 5,760,476

[45] Date of Patent: Jun. 2, 1998

[54] INTERCONNECT RUN BETWEEN A FIRST POINT AND A SECOND POINT IN A SEMICONDUCTOR DEVICE FOR REDUCING ELECTROMIGRATION FAILURE

[75] Inventors: Charles J. Varker; Michael L. Dreyer, both of Scottsdale; Thomas E. Zirkle, Tempe, all of Ariz.

[73] Assignee: Motorola, Inc., Schaumburg, Ill.

[21] Appl. No.: 729,200

[22] Filed: Oct. 15, 1996

Related U.S. Application Data

[62] Division of Ser. No. 472,602, Jun. 7, 1995, abandoned, which is a division of Ser. No. 283,338, Aug. 1, 1994, Pat. No. 5,461,260.

[51] Int. Cl.$^6$ .................. H01L 23/48; H01L 29/46; H01L 23/532

[52] U.S. Cl. .................. 257/767; 257/773; 257/920; 257/775; 257/758; 257/740; 257/623

[58] Field of Search .................. 257/773, 775, 257/765–767, 920, 923, 758, 740, 786

[56] References Cited

U.S. PATENT DOCUMENTS

| | | | |
|---|---|---|---|
| 4,352,239 | 10/1982 | Pierce . | |
| 4,438,450 | 3/1984 | Sheng et al. | 257/767 |
| 4,812,419 | 3/1989 | Lee et al. | 437/203 |
| 5,229,647 | 7/1993 | Gnadinger | 257/774 |
| 5,243,221 | 9/1993 | Ryan et al. | 257/767 |
| 5,268,329 | 12/1993 | Chittipeddi et al. | 437/195 |
| 5,309,024 | 5/1994 | Hirano | 257/774 |
| 5,355,023 | 10/1994 | Tomioka et al. | 257/774 |
| 5,382,831 | 1/1995 | Atakov et al. | 357/767 |
| 5,559,055 | 9/1996 | Chang et al. | 438/586 |

FOREIGN PATENT DOCUMENTS

| | | |
|---|---|---|
| 0307722 | 3/1989 | European Pat. Off. . |
| 626722 | 3/1989 | European Pat. Off. . |
| 0333446 | 9/1989 | European Pat. Off. . |
| 609501 | 8/1994 | European Pat. Off. . |
| 4196428 | 7/1992 | Japan . |
| 5152299 | 6/1993 | Japan . |
| 00165 | 11/1996 | WIPO . |

OTHER PUBLICATIONS

"Electromigration–Induced Failures In Thin–Film Al–Cu Conductors", Agarwala et al., Journal of Electronic Materials, vol. 3, No. 1, 1974, pp. 137–153.

"Bulk Electromigration By Eliminating Grain Boundry Mass Flow In Continuous Aluminum Lines", Schreiber, Solid–State Electronics, May 1986, UK, vol. 29, No. 5, pp. 545–549.

Dreyer et al., "An Electromigration model . . . ", J. Appl. Phys., vol. 73, No. 10, Pt. 1, May 15, 1993, pp. 4894–4902.

*Primary Examiner*—T. Thomas
*Assistant Examiner*—Alexander Oscar Williams
*Attorney, Agent, or Firm*—Daniel R. Collopy

[57] ABSTRACT

In a first approach, an interconnect structure (10) reduces peak localized interconnect current density by distributing current flow around the perimeter (22) of an interlevel connector (14) in a semiconductor device. A first interconnect level (12) is connected to a second interconnect level by the interlevel connector (14), and the perimeter (22) of the interlevel connector (14) is located at the juncture between the first interconnect level (12) and the interlevel connector (14). The first interconnect level (12) has two or more fingers (16,18,20) protruding therefrom that connect to the perimeter (22) of the interlevel connector (14). At least one opening (36, 38) is disposed between two of the fingers (16,18,20) for dividing current flow. In a second approach, an interconnect level (50) is formed of a polycrystalline material and connects two points in the semiconductor device using essentially only a plurality of branches (52) each having a linewidth (W) less than the median grain size of the polycrystalline material. In a third approach, an interconnect run (60) consists essentially of a plurality of upper and lower straps (62, 64) connected by a plurality of interlevel connectors (66) so that a chain is provided which connects substantially the full length between two points in the semiconductor device.

8 Claims, 3 Drawing Sheets

INTERCONNECT RUN BETWEEN A FIRST POINT AND A SECOND POINT IN A SEMICONDUCTOR DEVICE FOR REDUCING ELECTROMIGRATION FAILURE

This application is a division of prior application Ser. No. 08/472,602, filed Jun. 7, 1995, now abandoned which is a division of application Ser. No. 08/283,338, filed Aug. 1, 1994, now U.S. Pat. No. 5,461,714.

BACKGROUND OF THE INVENTION

The present invention relates, in general, to semiconductor devices and, more particularly, to interconnect structures and methods of layout therefor that reduce electromigration at localized regions of high current density so that interconnect reliability is increased.

Electromigration-related reliability failures continue to be a problem as semiconductor device geometries shrink into the sub-micron range and current densities within these devices continue to increase. As a result of these trends, electromigration-related reliability is becoming sufficiently critical that the two-dimensional design layout, and particularly the interconnect layout, of semiconductor devices is increasingly dictated in part by factors associated with the reduction of electromigration. Interconnect structures carrying high current density in prior semiconductor devices have exhibited electromigration failure at regions of high localized current density, such as at the edges joining aluminum interconnect runs to vias between multi-level interconnects, at contacts between metal interconnects, and in geometrical inhomogeneities in local, silicon substrate interconnect runs. Accordingly, it is desirable to have a semiconductor device with an interconnect layout structure that reduces premature failure due to electromigration at regions of high localized current density.

DETAILED DESCRIPTION OF THE DRAWINGS

Briefly stated, in a first embodiment the present invention provides an interconnect structure for reducing peak localized interconnect current density by distributing current flow around the perimeter of an interlevel connector in a semiconductor device. A first interconnect level is connected to a second interconnect level by the interlevel connector, and the perimeter of the interlevel connector is located at the juncture between the first interconnect level and the interlevel connector. The first interconnect level has two or more fingers protruding therefrom that connect to the perimeter of the interlevel connector. At least one opening in the first interconnect level is disposed between two of the fingers for dividing current flowing from the first interconnect level to the interlevel connector.

Figure 1:
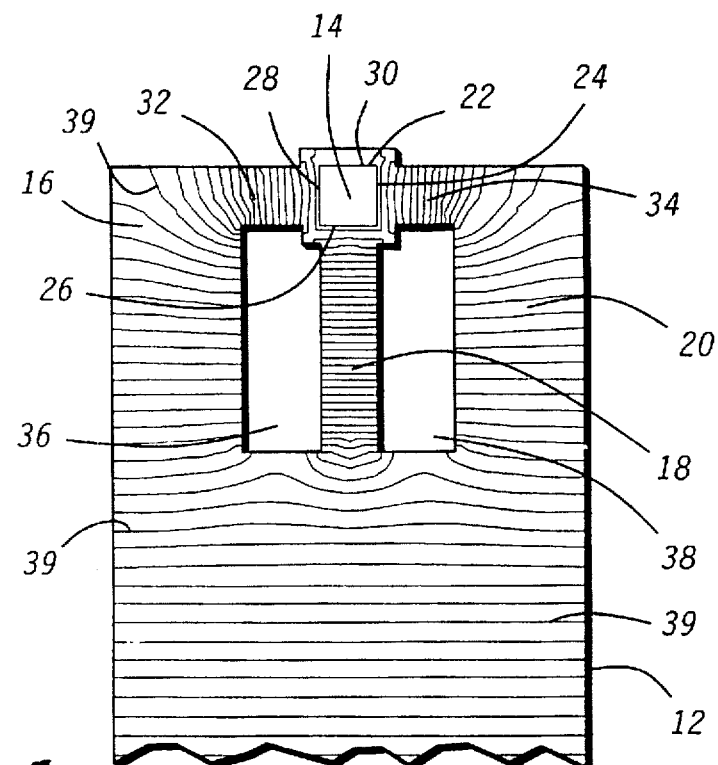
FIGS. 1 and 2 illustrate the two-dimensional layout for interconnect structures according to a first embodiment of the present invention.

The first embodiment of the present invention can be more fully described with reference to FIGS. 1 and 2. FIG. 1 illustrates an interconnect structure 10 having an interconnect level 12 and an interlevel connector 14 connected thereto. Interconnect level 12 has three fingers 16, 18, and 20 protruding therefrom and connecting to interlevel connector 14. Interlevel connector 14 has a closed perimeter 22 comprising edges 24, 26, 28, and 30. Finger 16 has an extension 32 that connects to edge 28, finger 18 connects to edge 26, and finger 20 has an extension 34 that connects to edge 24. An opening 36 of interconnect level 12 is disposed between fingers 16 and 18, and an opening 38 is disposed between fingers 18 and 20. Interlevel connector 14 connects interconnect level 12 to a second interconnect level (not shown).

In operation, current flows from interconnect level 12 through interlevel connector 14 to the second interconnect level (not shown). Specifically, current flow from interconnect level 12 is divided by fingers 16, 18 and 20. Opening 36 divides current flow between fingers 16 and 18, and opening 38 divides current flow between finger 18 and finger 20. Interconnect level 12 is patterned so that the current density in the regions near perimeter 22 of interlevel connector 14 (i.e. in each of fingers 16, 18, and 20 near perimeter 22) is substantially equal. Thus, extension 32, finger 18, and extension 34 have substantially equal current densities in the regions near connector 14.

The current density above is known to be directly proportional to the gradient of the electric potential in interconnect level 12. Equipotential lines 39 are shown in FIG. 1 for interconnect level 12. The distance between lines 39 in the regions near connector 14 in each of fingers 16, 18, and 20 is substantially equal indicating that the current density in these regions is substantially equal. Equipotential lines 39 substantially distant from connector 14 need not be equally spaced.

The patterning used for interconnect level 12 is selected to provide a resistance through each of fingers 16, 18 and 20, as measured from a common point of interconnect level 12 substantially distant from perimeter 22, that is substantially equal for each path. This ensures that these current paths are equally preferred and the current density in the regions near connector 14 is substantially equal in each of fingers 16, 18 and 20. If fingers 16, 18, and 20 are not equally-terminated (i.e. the cross-sectional areas of fingers 16, 18, and 20 are not equal) the resistance paths must be scaled in proportion to the fraction of this area for each of fingers 16, 18, and 20 to ensure proper current distribution in the region near connector 14, thus producing substantially equal current density within each of fingers 16, 18, and 20.

Each of fingers 16, 18, and 20 has a major longitudinal axis that intersects interlevel connector 14. For example, finger 16 has a longitudinal axis running through extension 32 which intersects interlevel connector 14. Also, here the longitudinal axis of each finger in FIG. 1 is separated by a radial rotation about interlevel connector 14 of about 90°. However, one skilled in the art will recognize that other radial rotations may be used. Preferably, this radial separation is at least 45°.

An advantage of the present invention is that current flow through interconnect level 12 is substantially distributed over a radial portion of perimeter 22 of preferably at least about 180°. For example, in FIG. 1 current flow is distributed over a radial portion of perimeter 22 of about 180°. This is in contrast to previous interconnect structures having a single finger providing current to an interlevel connector through substantially a single edge thereof. Such current flow over a single edge resulted in pronounced current crowding at that edge. Current crowding is a localized region of high current density and typically results in premature failure from electromigration effects. The present invention avoids this problem by distributing current flow over more than one edge.

One skilled in the art will recognize that the present invention may also be used with an interlevel connector having a more circular perimeter. With a circular perimeter, it is preferable that current flow be distributed over a radial portion of the perimeter of at least about 180°, for example, about 270°. One skilled in the art will also recognize that current flow may be distributed over a full 360° radius of the perimeter.

As a specific example of interconnect structure 10, interlevel connector 14 may be a tungsten via, and interconnect level 12 may be an aluminum interconnect level. Further, interlevel connector 14 may comprise one or more deposited (or grown) electrically-conductive layers, such as layers designed to diminish stress-migration and electromigration effects. Also, interconnect level 12 may comprise one or more deposited (or grown) electrically-conductive layers. One skilled in the art will recognize that the conductors used in connector 14 and interconnect level 12 may have layers composed of elemental, compound, alloy, or pseudo-alloy electrically-conductive materials. For example, the second interconnect level (not shown) may consist of a doped mono-crystalline silicon conductor, a local interconnect run in the underlying silicon substrate, or an extension of a CMOS or bipolar device structure as is typical in integrated circuits. Connector 14 may function primarily as the contact between the active devices formed in a monocrystalline silicon substrate and the local polycrystalline silicon or metal interconnect system.

Figure 2:
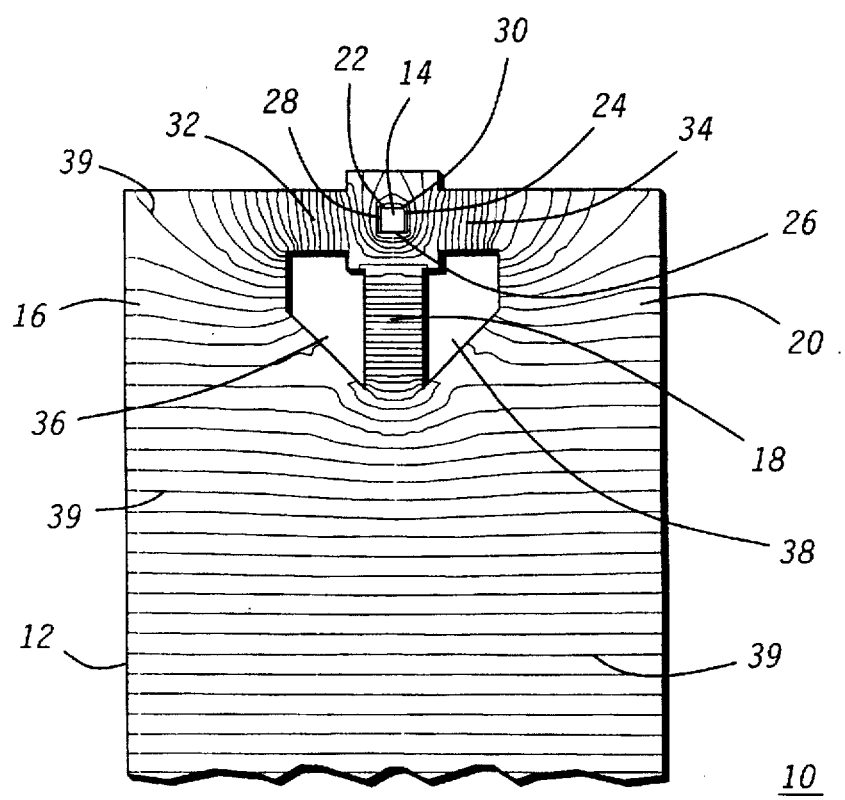

FIG. 2 illustrates an alternate interconnect structure 10 according to the first embodiment of the present invention. Common reference numbers from FIG. 1 are used for common elements in FIG. 2. FIG. 2 shows the effect of a different layout topology on the current density distribution in fingers 16, 18, and 20 (and in extensions 32 and 34) as well as the current density in the regions near the edge of the interlevel connector 14. The dimensions of that portion of interconnect level 12 immediately surrounding connector 14 may be made larger relative to the dimensions of connector 14 to improve the radial uniformity of current flow to an extent approaching 360° while also allowing greater tolerance for relative misalignment of interconnect level 12. Decreasing the overall geometrical size of interlevel connector 14 may also provide a significant advantage in the number of interconnect structures 10 possible within the layout of an integrated circuit, thus greatly reducing the likelihood of electromigration-induced early failures.

Briefly stated, a second embodiment of the present invention provides a method for fabricating an interconnect level in a semiconductor device to reduce the electromigration failure rate of the interconnect level. This method comprises the steps of selecting a preferred polycrystalline material to use in forming the interconnect level, and determining a median grain size ($D_{50}$) for the polycrystalline material. A first point and a second point of the semiconductor device are selected for electrical connection by the interconnect level, and these points are connected using essentially only a plurality of branches of the interconnect level wherein each of the branches has a linewidth less than the median grain size previously determined.

Figure 3:
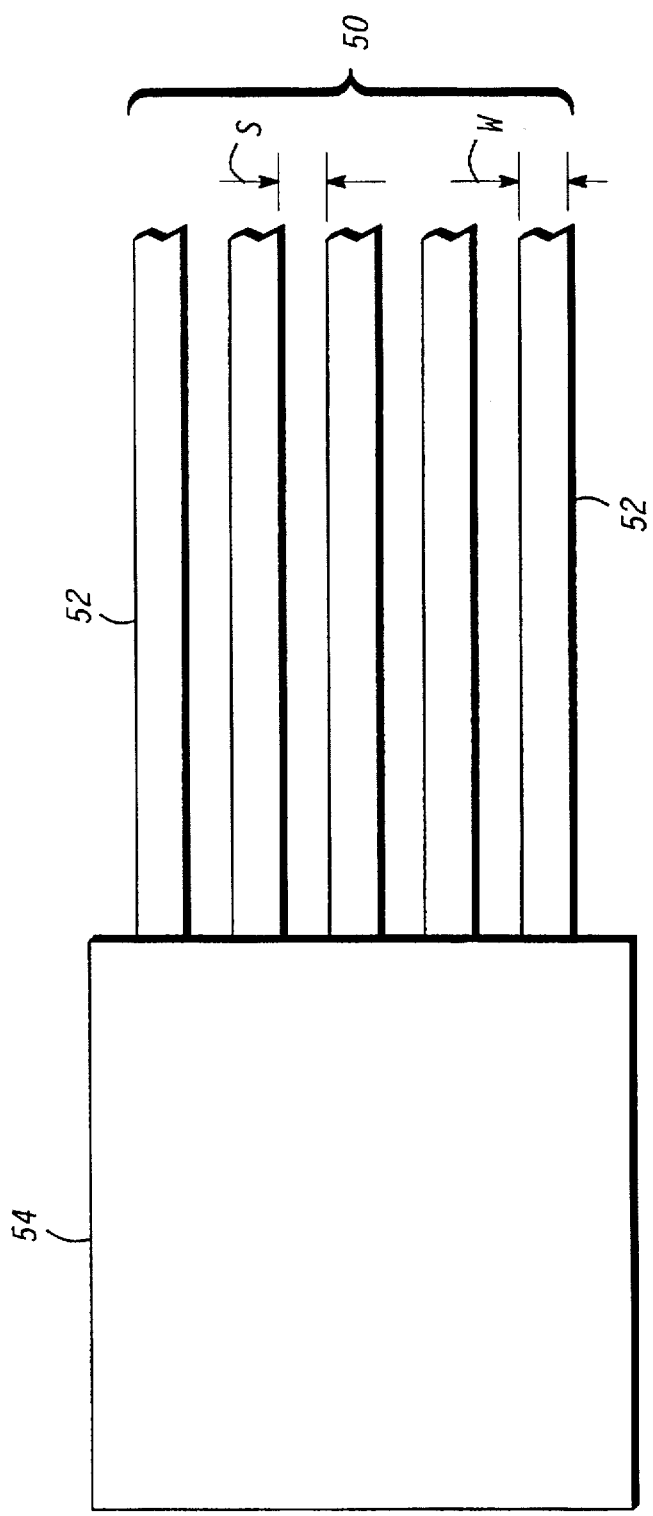
FIG. 3 illustrates the two-dimensional layout for an interconnect level according to a second embodiment of the present invention.

The second embodiment of the present invention can be more fully described with reference to FIG. 3. FIG. 3 illustrates a two-dimensional layout of an interconnect level 50. Interconnect level 50 comprises a plurality of branches 52 connected to a current source 54. Branches 52 may be for example aluminum interconnect lines, and current source 54 may be for example a bonding pad. The linewidth of each of branches 52 is indicated as "W" in FIG. 3, and the separation between each of branches 52 is indicated as "S".

It has been learned that when linewidth "W" is less than the median grain size of the polycrystalline material used to form branches 52, a significant decrease in the electromigration failure rate occurs. Thus, interconnect lines having a linewidth less than the median grain size will show a significant improvement in their reliability lifetime. Further, this improvement occurs for interconnect branches that join to current sources (or sinks) carrying a wide range of currents.

In contrast to the present invention, previous interconnect structures have typically used a design rule where interconnect linewidth is increased to reduce the local current density. However, according to the present invention, it has been found that when substantially all linewidths are less than the median grain size of the polycrystalline material used to form the interconnect, then the reliability of interconnect branches 52 increases. Therefore, according to the present invention it is preferable to use a larger number of branches 52 having a smaller linewidth rather than a single branch having a larger linewidth.

One skilled in the art will recognize that the median grain size is a statistical quantity representing a figure of merit for the size of conductor grains and can be derived from any one or more of a number of accepted measurement methodologies. The generic method involves repeated measurements of the spatial dimensions of conductor grains and subsequent determination of a statistical figure of merit, which is a function of the distribution of the measured dimension and appropriate assumptions made about the nature of the distribution.

One skilled in the art will further recognize that this median grain size is a measured characteristic dependent on (1) the method of deposition, (2) the condition of the surface onto which the material is deposited, (3) the composition of the surface onto which the material is deposited, and (4) the subsequent thermal history after deposition for the conductors forming the interconnect structure. These factors (1), (2), (3), and (4) comprise a so-called "deposition process" and can be adjusted as desired to achieve various grain sizes and distributions. The optimal line dimensions ("W" and "S" in FIG. 3) are established after this deposition process is determined.

The reliability of branches 52 is enhanced when the lines are sized to achieve a so-called bamboo structure, a characteristic in which the median grain size is significantly larger than the linewidth. A bamboo structure in narrow lines is structurally different from that for wide polycrystalline lines. The bamboo structure characteristically has single-conductor grains connected serially, and separated by grain boundaries oriented along the transverse linewidth dimension and (extending directly through the lines to the supporting substrate). In contrast, wide polycrystalline lines possessing linewidths larger than the median grain size have a large number of boundaries oriented in the direction of electron current flow.

One skilled in the art recognizes that electromigration is a diffusion phenomena in which material transport occurs preferentially in the direction of electron current flow. Material flow for lines that are significantly wider than the median grain size is dominated by grain boundary diffusion, which tends to result in shorter lifetimes because a large number of boundaries are oriented along the direction of electron current flow.

By utilizing a plurality of branches 52 possessing linewidths W less than the median grain size, a plurality of grain boundaries for each of branches 52 is oriented perpendicular to the direction of electron current flow. This limits the material flow by diffusion processes in the direction of electron current flow along grain boundaries and confines the material flow to inter-grain (lattice) diffusion, which is significantly slower than grain boundary diffusion. As a result, electromigration transport is reduced and reliability is increased.

This embodiment of the present invention can generally be used to connect any two points in a semiconductor device regardless of the distance between the two points or the current to be carried by the interconnect therebetween. However, the present invention is more advantageous when this distance is at least about 50 microns and the current density in each of the interconnect branches will exceed about $0.9 \times 10^5$ A/cm$^2$. One skilled in the art will recognize that the present invention may be applied to a wide variety of polycrystalline materials, such as for example polysilicon or aluminum-based conductors. When using aluminum as a polycrystalline material, for example, a typical median grain size is about 1.7 microns, and a typical linewidth of branches 52 is preferably less than about 0.9 microns. The aforementioned case is only for illustrative purposes, and as mentioned previously, the median grain size (and resulting optimal linewidth and space for FIG. 3) will vary for differing deposition processes.

One skilled in the art will also recognize that this embodiment of the present invention will improve the process of heat transfer from interconnect level 50 to the underlying substrate (not shown) by virtue of the smaller thermal foot print of each of branches 52 in the structure relative to a single wide line of a comparable width equal to a combined number of parallel branches 52.

Briefly stated, in a third embodiment the present invention provides an interconnect run between a first point and a second point in a semiconductor device that reduces electromigration failure. This interconnect run consists essentially of a plurality of upper straps connected to a plurality of lower straps by a plurality of interlevel connectors. Each of the upper straps is connected to two of the lower straps, and each of the lower straps is connected to two of the upper straps, forming a chain for substantially the full length from the first point to the second point. Preferably, none of the upper straps or the lower straps has a length greater than, for example, about 12 microns and the interlevel connectors are formed of a material substantially resistant to electromigration, as in for example tungsten-filled plugs.

Figure 4:
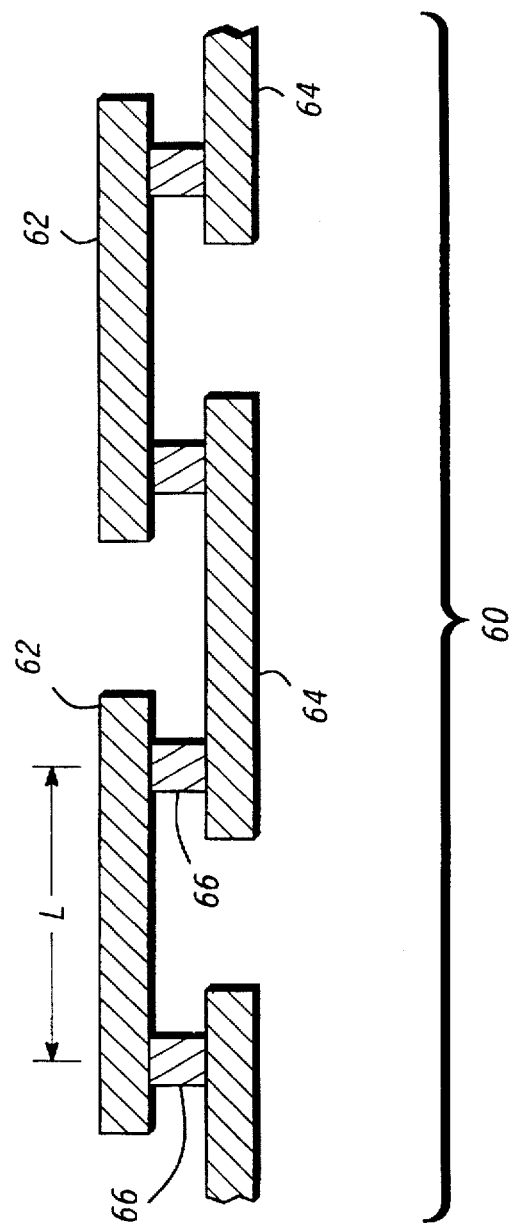
FIG. 4 illustrates a cross-sectional view of an interconnect run according to a third embodiment of the present invention.

This third embodiment of the present invention can be more fully described with reference to FIG. 4. FIG. 4 illustrates a cross-section of an interconnect run 60 having a plurality of upper straps 62 connected to a plurality of lower straps 64 by a plurality of interlevel connectors 66. The length of either one of upper straps 62 or lower straps 64 is substantially measured by the length (indicated as "L" in FIG. 4) from the center of one interlevel connector 66 to the next consecutive interlevel connector.

In interconnect run 60, when interlevel connectors 66 are formed of a material that does not exhibit electromigration, the material used to form upper straps 62 and lower straps 64 tends to move freely away from its interface with interlevel connectors 66, thus leading to electromigration failures. This phenomenon is seen, for example, where upper and lower straps 62 and 64 are both formed of aluminum and interlevel connectors 66 are tungsten. It has been discovered, however, if the length of each of straps 62 and 64 is reduced sufficiently, then a counter-migration of interconnect atoms will occur in the opposite direction to the electromigration flow. This counter-migration is the result of compressive stress, and ultimately leads to a desirable non-flow condition as described below.

Those skilled in the art understand that typical interconnect structures are encapsulated in isolating materials which completely encompass the interconnect structure. When electromigration accelerating conditions (e.g. electrical current and temperature) are applied to an interconnect structure, material is displaced in the interconnect structure due to the applied current and temperature. The state of the interconnect structure changes in a time dependent manner as a result of this electromigration-induced material flow, becoming more mechanically tensile in areas where the material is flowing away from (cathode regions) and more mechanically compressive in areas where the material is flowing towards (anode regions). As material accumulates in an anode region (e.g. at an interface between an interlevel connector and a strap), the mechanically-compressive stress increases and tends to retard further material flow into that region. Once a critical level of mechanical stress is reached, no further flow of material into that region is possible. After a sufficient period of time, like non-flow regions extend along interconnect run 60 and provide a static condition in which substantially no additional material will flow (even in the presence of current and thermal stress). This non-flow condition prevents further electromigration so that reliability is increased. The length of straps 62 and 64 is selected to be sufficiently small to accomplish this condition.

It is preferable that the strap length "L" be less than for example about 12 microns, but this will vary depending on the particular deposition process used to form interconnect run 60. Also, this embodiment is more advantageous when the full length of interconnect run 60 is more than for example about 80 microns, again depending on the deposition process. As a specific example, interlevel connector 66 may be a via comprising tungsten, upper and lower straps 62 and 64 may comprise aluminum, and the strap length may be less than about 6 microns. However, one skilled in the art will recognize that the lengths mentioned here and above may vary depending on the factors discussed above.

By now, it should be appreciated that there has been provided a semiconductor device interconnect layout method and structure for reducing premature electromigration failure due to high localized current density. As a result, reliability lifetimes for integrated circuits may be significantly enhanced.

We claim:

1. An interconnect run between and electrically coupling a first point and a second point in a semiconductor device that reduces electromigration failure, consisting essentially of a plurality of upper straps connected to a plurality of lower straps by a plurality of interlevel connectors substantially resistant to electromigration, said plurality of lower straps comprising at least a first lower strap, a second lower strap and a third lower strap, and said plurality of interlevel connectors comprising at least a first interlevel connector and a second interlevel connector, wherein the first lower strap is connected to said first point and to the first interlevel connector and the second lower strap is connected to said second point and to the second interlevel connector and the second lower strap is not connected to the first lower strap, and wherein each of said plurality of upper straps is connected to only two of said plurality of lower straps and each of said plurality of lower straps other than the first lower strap and the second lower strap is connected to only two of said plurality of upper straps, and wherein none of said plurality of upper straps or said plurality of lower straps has a length greater than about 12 microns.

2. The interconnect run of claim 1 wherein a distance from one of said interlevel connectors to a next closest one of said interlevel connectors is less than about 6 microns.

3. The interconnect run of claim 1 wherein:

each of said interlevel connectors is a via comprising tungsten; and said upper straps and said lower straps comprise aluminum.

4. The interconnect run of claim 1 wherein said full length of said interconnect run is more than about 80 microns.

5. An interconnect run between and electrically coupling a first point and a second point in a semiconductor device that reduces electromigration failure, consisting essentially of a plurality of upper straps connected to a plurality of lower straps by a plurality of interlevel connectors substantially resistant to electromigration, said plurality of upper straps comprising at least a first upper strap, a second upper strap and a third upper strap, and said plurality of interlevel connectors comprising at least a first interlevel connector and a second interlevel connector, wherein the first upper strap is connected to said first point and to the first interlevel connector and the second upper strap is connected to said second point and to the second interlevel connector and the second upper strap is not connected to the first upper strap, and wherein each of said plurality of upper straps other than the first upper strap and the second upper strap is connected to only two of said plurality of lower straps and each of said plurality of lower straps is connected to only two of said plurality of upper straps, and wherein none of said plurality of upper straps or said plurality of lower straps has a length greater than about 12 microns.

6. The interconnect run of claim 1 wherein a distance from one of said interlevel connectors to a next closest one of said interlevel connectors is less than about 6 microns.

7. The interconnect run of claim 1 wherein:

each of said interlevel connectors is a via comprising tungsten; and said upper straps and said lower straps comprise aluminum.

8. The interconnect run of claim 1 wherein said full length of said interconnect run is more than about 80 microns.

* * * * *